(12) United States Patent
Elie et al.

(10) Patent No.: US 11,933,084 B2
(45) Date of Patent: Mar. 19, 2024

(54) SENSOR AND DEVICE FOR PRESENCE DETECTION

(71) Applicant: Vitesco Technologies GmbH, Regensburg (DE)

(72) Inventors: Olivier Elie, Toulouse (FR); Gabriel Spick, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 280 days.

(21) Appl. No.: 17/606,596

(22) PCT Filed: May 18, 2020

(86) PCT No.: PCT/EP2020/063770
§ 371 (c)(1),
(2) Date: Oct. 26, 2021

(87) PCT Pub. No.: WO2020/234219
PCT Pub. Date: Nov. 26, 2020

(65) Prior Publication Data
US 2022/0235589 A1    Jul. 28, 2022

(30) Foreign Application Priority Data
May 22, 2019   (FR) .................... 1905365

(51) Int. Cl.
*H03K 17/955*   (2006.01)
*E05B 81/76*    (2014.01)

(52) U.S. Cl.
CPC .......... *E05B 81/77* (2013.01); *H03K 17/955* (2013.01); *H03K 2217/960725* (2013.01); *H03K 2217/960735* (2013.01)

(58) Field of Classification Search
CPC ....... E05B 81/76; E05B 81/77; H03K 17/955; H03K 2217/960725; H03K 2217/960735
(Continued)

(56) References Cited

U.S. PATENT DOCUMENTS 10,626,639 B2   4/2020 Hourne et al.
2012/0274488 A1 11/2012 Kapusta
(Continued)

FOREIGN PATENT DOCUMENTS

EP   2779463 A2   9/2014
FR   3036480 A1 * 11/2016 ............. E05B 81/78
(Continued)

OTHER PUBLICATIONS

English translation FR 3036480 A1 (Year: 2016).*
(Continued)

*Primary Examiner* — Jermele M Hollington
*Assistant Examiner* — Courtney G Mcdonnough
(74) *Attorney, Agent, or Firm* — BUCHANAN INGERSOLL & ROONEY PC

(57) ABSTRACT

A presence detection sensor for unlocking an opening panel of a motor vehicle, said sensor comprising a microcontroller implementing an analog-digital converter and comprising a first input, a second input forming the voltage reference of said analog-digital converter, a third input for supplying the microcontroller with voltage, and a plurality of inputs-outputs, and a capacitive voltage divider connected to at least one of the inputs-outputs of the plurality of inputs-outputs. The sensor comprises a resistive module connected between the first input and the second input of the microcontroller and a capacitive module connected between the second input of the microcontroller and a ground.

11 Claims, 1 Drawing Sheet

(58) Field of Classification Search
USPC .......................................................... 324/686
See application file for complete search history.

(56) References Cited

U.S. PATENT DOCUMENTS

2014/0266847 A1* 9/2014 Shen ..................... H03M 1/38
341/158
2020/0048940 A1* 2/2020 Hourne ................... E05B 81/77

FOREIGN PATENT DOCUMENTS

FR           3036480  A1    11/2016
FR           3059455  A1     6/2018

OTHER PUBLICATIONS

International Search Report and Written Opinion for International Application No. PCT/EP2020/063770, dated Jul. 30, 2020, with partial English translation, 11 pages.
International Search Report and Written Opinion for International Application No. PCT/EP2020/063770, dated Jul. 30, 2020, 16 pages (French).

* cited by examiner

[Fig. 1]
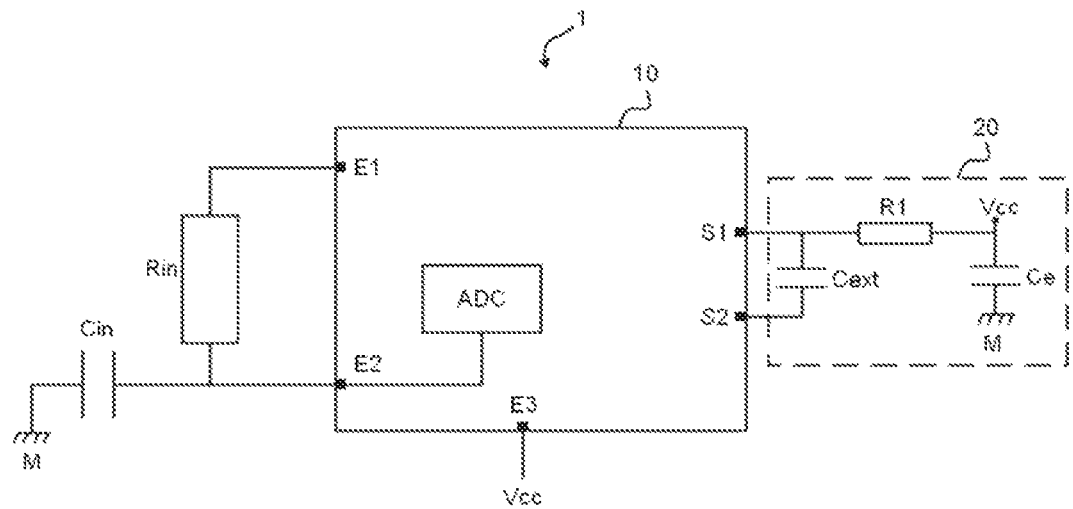
[Fig. 2]
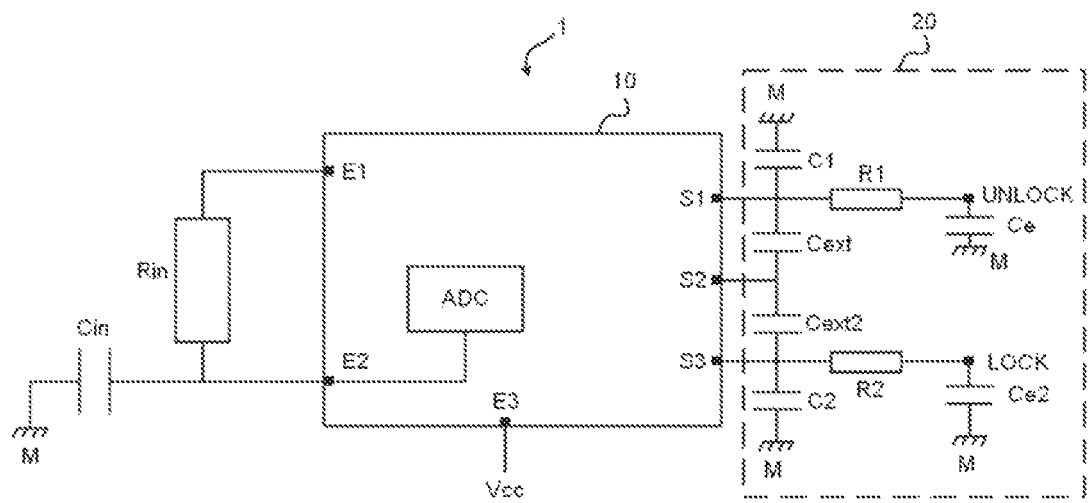
[Fig. 3]
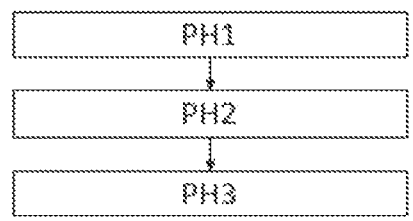

SENSOR AND DEVICE FOR PRESENCE DETECTION

CROSS REFERENCE TO RELATED APPLICATIONS

This application is the U.S. National Phase application of PCT International Application No. PCT/EP2020/063770, filed May 18, 2020, which claims priority to French Patent Application No. 1905365, filed May 22, 2019, the contents of such applications being incorporated by reference herein.

FIELD OF THE INVENTION

The present invention relates to the motor vehicle field and more specifically relates to the unlocking of an access to a motor vehicle. The subject matter of the invention is a sensor and a method for detecting the presence of a user near a vehicle, as well as a vehicle comprising such a sensor.

The invention particularly aims to improve the sensitivity of existing CVD and DCVD type sensors.

BACKGROUND OF THE INVENTION

In a motor vehicle, it is known for a system to be used for unlocking an access comprising a sensor for detecting the presence of a user. Such a sensor is known to be in the form of a capacitive proximity sensor allowing detection, for example, of the presence of a hand of the user on the handle of a door in order to unlock the door or even allowing detection of the passage of a foot of the user under the trunk of the vehicle in order to unlock the trunk. In particular, when the user moves their hand from a first position, for example, at a distance from a door handle, to a second position, on said handle, the sensor detects this presence, which causes the door to unlock.

In a known solution, called CVD (Capacitive Voltage Divider), the detection sensor comprises a printed circuit comprising a capacitor, called "detection capacitor", forming a first electrode and a capacitor, called "storage capacitor", connected via switches to a voltage generator and to a microcontroller implementing an analog-digital converter allowing the electrical charge stored in the storage capacitor to be quantified.

In the absence of a user in the proximity of the sensor, the storage capacitor charges by a nominal charge defining a nominal storage voltage. When the hand of the user is located in the proximity of the electrode, the user acts as a second electrode, connected to ground, which increases the capacitance value of the detection capacitor beyond its nominal capacitance value measured in the absence of a user.

In order to detect the presence of a user, the sensor firstly comprises an acquisition phase that allows the storage capacitor to be charged, with said capacitor being previously discharged. This acquisition phase firstly involves the detection capacitor being charged by the voltage generator, followed, secondly, by the conductive transfer of current from the charge stored in the detection capacitor to the storage capacitor. The voltage at the terminals of the storage capacitor is subsequently measured in a second phase, called measurement phase.

When the storage capacitor is charged without a user coming near the sensor, the charge thereof at the end of the acquisition phase corresponds to its nominal charge value and the storage voltage at the terminals thereof therefore corresponds to a nominal storage voltage. However, when a user is present in the proximity of the sensor during the acquisition phase, the capacitance value of the detection capacitor increases due to the presence of the user, so that the voltage defined at the terminals of the storage capacitor at the end of the acquisition phase is higher than the voltage defined by the nominal charge measured in the absence of human presence in the proximity of the sensor. In this case, the voltage at the terminals of the storage capacitor is equal to a detection voltage that is higher than the nominal storage voltage. As soon as a user has been detected, the microcontroller sends a detection signal to an electronic computer of the vehicle so that it authenticates the user and unlocks the one or more opening(s) as applicable.

This CVD type solution allows measurements and rapid detection of the presence of a user. However, it has been noted that this operation could generate very high electromagnetic interference, in particular low-frequency noise, that can interfere with other electronic devices of the vehicle. Moreover, the sensitivity of such a sensor can be relatively low, which implies a short detection distance.

Furthermore, in order to at least partly overcome these disadvantages, it is known for an alternative solution to be used, called DCVD (Differential Capacitive Voltage Divider). In this solution, the detection sensor is identical to that of the CVD solution but comprises a different arrangement of switches so that it can operate differently. This solution firstly involves performing a first acquisition phase, identical to the acquisition phase of the CVD solution, followed by a second acquisition phase involving charging the storage capacitor from the voltage delivered by the voltage generator, then discharging the storage capacitor into the detection capacitor.

When the detection capacitor is charged without a user coming near the sensor, the charge of the detection capacitor at the end of the second acquisition phase corresponds to its nominal charge value and the storage voltage at the terminals of the storage capacitor therefore corresponds to a nominal storage voltage. However, when a user is present in the proximity of the sensor during the second acquisition phase, the capacitance value of the detection capacitor increases so that the voltage defined at the terminals thereof at the end of the acquisition phase is lower than the voltage defined by the nominal charge measured in the absence of human presence in the proximity of the sensor.

Once the first acquisition phase and the second acquisition phase have been completed, the microcontroller analyzes the difference between the voltage measured during the first acquisition phase, which increases when a user is present in the proximity of the sensor, and the voltage measured during the second acquisition phase, which decreases when a user is present in the proximity of the sensor. Sequencing these two acquisition phases can significantly increase the duration of the measurements and therefore make the detection of the presence of a user in the proximity of the sensor particularly time-consuming, which is a major disadvantage.

The DCVD capacitive measurement uses the capacitive divider bridge principle: the voltage measured at the terminals of the electrode capacitor is connected to its own capacitance. In order to have satisfactory sensitivity, the measurement of this voltage, performed by the analog-digital converter of the microcontroller, must have the best possible resolution, i.e. a variation of one digit in the digital value measured by the analog-digital converter corresponds to the lowest possible voltage variation.

The voltage corresponding to a digit is provided by the following formula:

$$\Delta V = V_{ref\_ADC}/(2^{ADC_{bit}}-1) \qquad \text{[Math. 1]}$$

where $ADC_{bit}$ corresponds to the number of bits of the analog-digital converter and $V_{ref\_ADC}$ corresponds to the reference voltage of the analog-digital converter.

Therefore, the sensitivity can be reduced either by reducing $V_{ref\_ADC}$ or by increasing $ADC_{bit}$.

It is known in the prior art for the reference voltage $V_{ref\_ADC}$ to be adjusted by using a resistive divider bridge at the input of the microcontroller in order to adapt the voltage reference $V_{ref\_ADC}$ of the analog-digital converter as close as possible to the operating zone of the sensor. This reference voltage $V_{ref\_ADC}$ must be adjusted so that it is always higher than the voltage to be measured, otherwise the measurement will be saturated.

However, it appears that, with such a circuit, the capacitive DCVD signal is sometimes too weak to have satisfactory sensitivity. Moreover, adjusting the reference voltage $V_{ref\_ADC}$ using a resistive divider bridge does not allow the resolution of the analog-digital converter to be maximized since, in order to avoid the saturation in the worst case situations, it is then necessary for the reference voltage $V_{ref\_ADC}$ to be overestimated.

A requirement therefore exists for a simple, reliable, and effective solution allowing at least some of these disadvantages to be overcome, and in particular aiming to improve the sensitivity of the existing detection sensors.

SUMMARY OF THE INVENTION

To this end, an aspect of the invention is, firstly, a presence detection sensor for unlocking an opening panel of a motor vehicle, said sensor comprising:

a microcontroller comprising an analog-digital converter, a first input-output port, a second input-output port forming the voltage reference of said analog-digital converter, a third input-output port for supplying the microcontroller with voltage, a fourth input-output port and a fifth input-output port, called "connection ports";

a capacitive voltage divider connected to said connection input-output ports and comprising at least one detection capacitor and at least one storage capacitor;

the sensor being characterized in that it comprises a resistive module connected between the first input-output port and the second input-output port of the microcontroller and a capacitive module connected between the second input-output port of the microcontroller and a ground, and in that the microcontroller is configured to internally connect the first input-output port and the third input-output port during a predetermined duration, called "charging duration", of the capacitive module in order to dynamically establish the reference voltage of the analog-digital converter. The term "input-output" is understood to mean an input or an output or even both an input and an output if applicable.

The microcontroller can thus control the charge of the capacitive module through the resistive module in order to dynamically set the reference voltage of the analog-digital converter and to thus optimize the sensitivity of the sensor. In other words, such control allows an optimal reference voltage to be used that allows the performance capabilities of the sensor to be improved in terms of sensitivity. Moreover, the use of a capacitive module for which the microcontroller can dynamically control the charge, as opposed to continuous control of the reference voltage by the microcontroller, allows the current consumption of the sensor to be reduced. Furthermore, the use of a resistive module and of a capacitive module allows the number of components and resources that are necessary to be reduced compared to the existing solutions, in particular in a "Vref hopping" type architecture (the principle of which is known to a person skilled in the art).

Preferably, the resistive module is made up of a single resistor, called "input resistor", in order to simplify the architecture of the sensor. For example, the value of the input resistance is of the order of 500 ohms.

More preferably, the capacitive module is made up of a single capacitor, called "input capacitor", for example, with a value of the order of 220 nF in order to simplify the architecture of the sensor.

The capacitive voltage divider equally can be of the CVD type or of the DCVD type.

An aspect of the invention also relates to a motor vehicle comprising at least one sensor as described above.

Finally, an aspect of the invention relates to a method for detecting the presence of a user in the proximity of a sensor as previously described, said method comprising:

an initialization phase, during which the microcontroller firstly charges the capacitive module to the power supply voltage by connecting the first input-output port to the third input-output port during the charging duration, then, once charging is complete, performs a capacitive measurement in order to deduce therefrom an optimal reference voltage and the charging time required to obtain this optimal reference voltage;

a reference acquisition phase, during which the microcontroller controls the capacitive voltage divider so that it performs a series of capacitive measurements at the optimal reference voltage determined during the initialization phase in order to obtain a reference value of the measured capacitive signal, for example, a digital value corresponding to the average of the successive capacitive measurements that have been performed (for example, between 4 to 8 acquisitions);

a measurement phase, during which the microcontroller controls the capacitive voltage at the determined optimal reference voltage and said capacitive voltage divider periodically measures the voltage value at the terminals of the storage capacitor, so as to detect or not detect a human presence in the proximity of the sensor.

The terms "capacitive measurements" are understood to mean the measurement of the voltage defined at the terminals of the storage capacitor.

According to one aspect of the invention, when the microcontroller detects the saturation of the analog-digital converter during the measurement phase, then the microcontroller repeats the initialization and reference acquisition phases in order to modify the optimal reference voltage and the capacitive signal reference, then resumes the measurement phase.

Preferably, the optimal reference voltage is higher than 10 to 20% at the voltage measured at the terminals of the storage capacitor in order to avoid the saturation of said voltage signal during nominal operation of the sensor, for example, in the event that a hand is placed on the handle of an opening with the palm over the entire unlocking zone or even when a finger is pressed on a locking zone in the case of a handle sensor.

In one embodiment, the method comprises, between the reference acquisition phase and the measurement phase, a determination phase, during which the microcontroller determines at least one threshold for detecting a human presence on the basis of the reference capacitive signal, with the measurement phase then being carried out in order to detect or not detect a human presence in the proximity of the sensor as a function of the at least one determined detection threshold.

BRIEF DESCRIPTION OF THE DRAWINGS

Further features and advantages of aspects of the invention will become more clearly apparent from reading the following description. This description is purely illustrative and must be read with reference to the accompanying drawings, in which:

FIG. 1 illustrates a first embodiment of the sensor according to the invention;

FIG. 2 illustrates a second embodiment of the sensor according to the invention;

FIG. 3 illustrates an embodiment of the method according to the invention.

DETAILED DESCRIPTION OF THE PREFERRED EMBODIMENTS

The sensor according to an aspect of the invention is intended to be mounted in a motor vehicle and, more specifically, in a door handle or in a rear trunk of a motor vehicle in order to detect the presence of a user, for example, to allow opening panels of the vehicle to be unlocked.

FIG. 1 shows an example of an electronic circuit of the sensor 1 according to an aspect of the invention. The sensor 1 comprises a microcontroller 10 and a capacitive voltage divider 20.

The microcontroller 10 comprises an analog-digital converter ADC, a first input-output port E1, a second input-output port E2, a third input-output port E3, a fourth input-output port S1 and a fifth input-output port S2, with these latter two ports being denoted connection input-output ports S1, S2. The terms "the microcontroller 10 comprises an analog-digital converter ADC" are understood to mean that the microcontroller 10 implements a hardware analog-digital converter ADC or is configured to implement an analog-digital converter ADC using software.

The microcontroller 10 is configured to internally electrically connect the first input-output port E1 and the third input-output port E3 so that they are at the same potential and to internally electrically disconnect the first input-output port E1 and the third input-output port E3. The second input-output port E2 forms the voltage reference of the analog-digital converter ADC. The third input-output port E3 is the input for supplying the microcontroller 10 with a power supply voltage Vcc, in a manner per se known.

In the examples described hereafter, the sensor 1 is of the CVD (Capacitive Voltage Divider) type but equally could be of the DCVD (Differential Capacitive Voltage Divider) type in another embodiment.

The capacitive voltage divider 20 comprises a first detection capacitor Ce and a first storage capacitor Cext. Each connector of the first storage capacitor Cext is respectively electrically connected to a connection input-output port S1, S2. A resistor R1 is connected between a fourth input-output port S1 and a terminal of the first detection capacitor Ce connected to the power supply voltage Vcc. The first detection capacitor Ce represents the equivalent capacitance of the electrode of the sensor 1, which capacitance varies with the approach of the body part of a user, for example, a hand. In order to be able to charge the first detection capacitor Ce and to detect presence in CVD or DCVD mode, the first detection capacitor Ce can be intermittently connected, in a manner per se known (via a switch, not shown in the figures), at the power supply voltage Vcc.

The sensor 1 comprises a resistive module Rin connected between the first input-output port E1 and the second input-output port E2 of the microcontroller 10 and a capacitive module Cin, connected between the second input-output port E2 of the microcontroller 10 and a ground M. In this preferred example, the resistive module Rin is made up of a single resistor, called "input resistor", and the capacitive module Cin is made up of a single capacitor, called "input capacitor". In another embodiment, the resistive module Rin could comprise a plurality of resistors and the capacitive module Cin could comprise a plurality of capacitors.

The microcontroller 10 is configured to internally connect the first input-output port E1 and the third input-output port E3 during a predetermined duration, called "charging duration", in order to charge the capacitive module Cin and to thus dynamically establish the reference voltage of the analog-digital converter ADC.

In a second embodiment illustrated in FIG. 2, the microcontroller 10 further comprises a sixth input-output port S3 (called "connection port", like the fourth input-output port S1 and the fifth input-output port S2) and the capacitive voltage divider 20 comprises, in addition to the elements already present in the first embodiment, a first filtering capacitor C1, a second storage capacitor Cext2, a second filtering capacitor C2, a second resistor R2 and a second detection capacitor Ce2.

The first filtering capacitor C1 is connected between the first input-output port S1 of the microcontroller 10 and the ground M and allows filtering of the current signal circulating between the first input-output port S1 and the first detection capacitor Ce via the first resistor R1. The first resistor R1 is connected between the first input-output port S1 of the microcontroller 10 and an unlocking terminal, denoted "UNLOCK" terminal, assuming the form of an electrode for unlocking the opening panels of the vehicle represented by the first detection capacitor Ce. In other words, the detection of an unlocking request by a user is detected when the voltage measured on the UNLOCK unlocking terminal exceeds a predetermined threshold.

The second storage capacitor Cext2 is connected between the fifth input-output port S2 and the sixth input-output port S3 of the microcontroller 10. The second filtering capacitor C2 is connected between the sixth input-output port S3 of the microcontroller 10 and the ground M and allows filtering of the current signal circulating between the sixth input-output port S3 and the second detection capacitor Ce2 via the second resistor R2. The second resistor R2 is connected between the third input-output port S3 of the microcontroller 10 and a locking terminal, denoted "LOCK" terminal, assuming the form of an electrode, different from the unlocking electrode, for locking the opening panels of the vehicle represented by the second detection capacitor Ce2. In other words, the detection of a locking request by a user is detected when the voltage measured on the LOCK locking terminal exceeds a predetermined threshold.

As a variant, it is to be noted that the capacitive voltage divider 20 could, whilst fulfilling the same function, comprise a different number and different types of components and/or be arranged differently.

An embodiment of the method according to an aspect of the invention will now be described with reference to FIG. 3 in particular.

Firstly, the microcontroller 10 electrically connects the first input-output port E1 and the third input-output port E3 so that the voltage defined between the first input-output port E1 and the ground M is equal to the power supply voltage Vcc of the microcontroller 10, which is defined between the third input-output port E3 and the ground M.

This voltage defined between the first input-output port E1 and the ground M allows the input capacitor of the capacitive module Cin to be charged through the input resistor of the resistive module Rin and at the second input-output port E2 that forms the reference voltage of the analog-digital converter ADC. The electrical connection time between the first input-output port E1 and the third input-output port E3 thus defines the charging time of the input capacitor of the capacitive module Cin. The reference voltage of the analog-digital converter ADC thus can be set by the microcontroller 10 by adjusting the charging time t according to the following formula:

$$V_{ref\_ADC} = Vcc \times \left(1 - e^{\frac{t}{Rin \cdot Cin}}\right) \quad \text{[Math. 2]}$$

where $V_{ref\_ADC}$ is the reference voltage of the analog-digital converter ADC, Vcc is the power supply voltage of the microcontroller 10, "Rin" is the value of the input resistance of the resistive module Rin and "Cin" is the value of the input capacitance of the capacitive module Cin.

At the end of the charging duration, the microcontroller 10 electrically disconnects the first input-output port E1 and the third input-output port E3 so that the voltage is set and stable at the terminals of the input capacitor of the capacitive module Cin. The microcontroller 10 then measures the voltage defined between the fourth input-output port S1 and the ground M, i.e. the voltage defined at the terminals of the first storage capacitor Cext, the variations of which mirror the variations of the first detection capacitor Ce.

Once charged, a capacitive measurement of the voltage at the terminals of the storage capacitor Cext is performed by the microcontroller 10 using the capacitive voltage divider 20 in order to deduce therefrom an optimal reference voltage, that is slightly higher than the measured voltage, for example, by 10%, and the charging time required to obtain this optimal reference voltage.

Subsequently, in a reference acquisition phase PH2, the microcontroller 10 controls the capacitive voltage divider 20 so that it performs a series of capacitive measurements at the optimal reference voltage determined during the initialization phase PH1, in order to obtain a reference value of the capacitive signal that will subsequently allow the detection thresholds to be determined that will be used as criteria for the detection, in a manner per se known.

Subsequently, in a measurement phase PH3, the microcontroller 10 controls the capacitive voltage divider 20 so that it periodically measures the value of the voltage defined between the fourth input-output port S1 and the ground M (voltage at the terminals of the first storage capacitor Cext) and compares it to the optimal reference voltage determined during the reference acquisition phase PH2, so as to detect or not detect a human presence, for example, a hand, in the proximity of the sensor.

If the microcontroller 10 does not detect the saturation of the analog-digital converter ADC, i.e. the output value of the analog-digital converter ADC is lower than ($2^{ADC\_bits}$-margin), where ADC_bits is the number of bits of the analog-digital converter ADC, then the microcontroller 10 continues to use the optimal reference voltage value defined during the initialization phase PH1.

If the microcontroller 10 detects the saturation of the analog-digital converter ADC, i.e. the output value of the analog-digital converter ADC is higher than ($2^{ADC\_bits}$-margin), then the microcontroller 10 repeats the initialization PH1 and reference acquisition PH2 phases in order to modify the optimal reference voltage and the capacitive signal reference, then phase PH3 is periodically repeated.

The above example has been provided for presence detection when unlocking an opening panel with equal reference to FIG. 1 and FIG. 2 (UNLOCK terminal of FIG. 2 in particular), but it is also applicable to presence detection when locking an opening panel with equal reference to FIG. 1 and FIG. 2 (LOCK terminal of FIG. 2 in particular).

The method according to an aspect of the invention thus allows the microcontroller 10 to adapt the reference voltage $V_{ref\_ADC}$ of the analog-digital converter ADC in order to optimize the use of the sensor 1 and to thus improve the nominal performance capabilities.

In a "Vref hopping" type architecture, an aspect of the invention particularly allows the type of components to be reduced by allowing the reference voltage to be controlled based on the charge of the capacitive module Cin, in order to define the "Vref hopping" stages, in a manner that is known to a person skilled in the art.

REFERENCES

1: sensor
10: microcontroller
20: capacitive voltage divider
ADC: analog-digital converter
E1: first input-output port
E2: second input-output port
E3: third input-output port
S1: fourth input-output port (called "connection port")
S2: fifth input-output port (called "connection port")
Vcc: power supply voltage
Ce: first detection capacitor
Cext: first storage capacitor
R1: resistor
M: ground
Rin: resistive module
Cin: capacitive module
S3: sixth input-output port (called "connection port")
C1: first filtering capacitor
Cext2: second storage capacitor
C2: second filtering capacitor
R2: second resistor
Ce2: second detection capacitor
UNLOCK: unlocking terminal
LOCK: locking terminal

The invention claimed is:

1. A presence detection sensor for unlocking an opening panel of a motor vehicle, said sensor comprising:
   a microcontroller comprising an analog-digital converter, a first input-output port, a second input-output port forming a voltage reference of said analog-digital converter, a third input-output port for supplying the microcontroller with voltage, a fourth input-output port and a fifth input-output port, called "connection ports";
   a capacitive voltage divider connected between said fourth input-output port and said fifth input-output port and comprising at least one detection capacitor and at least one storage capacitor;

a resistive module connected between the first input-output port and the second input-output port of the microcontroller; and a capacitive module connected between the second input-output port of the microcontroller and a ground, and the microcontroller is configured to internally connect the first input-output port and the third input-output port during a predetermined charging duration of the capacitive module in order to dynamically establish the reference voltage of the analog-digital converter.

2. The sensor as claimed in claim 1, wherein the resistive module is made up of a single resistor.

3. The sensor as claimed in claim 2, wherein the value of the resistance is of the order of 500 Ω.

4. The sensor as claimed in claim 1, wherein the capacitive module is made up of a single capacitor.

5. The sensor as claimed in claim 4, wherein the value of the capacitance is of the order of 220 nF.

6. The sensor as claimed in claim 1, wherein the capacitive voltage divider is of the CVD or DCVD type.

7. A motor vehicle comprising at least one presence detection sensor for unlocking an opening panel of the motor vehicle, the sensor comprising:
- a microcontroller comprising an analog-digital converter, a first input-output port, a second input-output port forming a voltage reference of said analog-digital converter, a third input-output port for supplying the microcontroller with voltage, a fourth input-output port and a fifth input-output port, called "connection ports";
- a capacitive voltage divider connected to said connection input-output ports and comprising at least one detection capacitor and at least one storage capacitor; and
- a resistive module connected between the first input-output port and the second input-output port of the microcontroller and a capacitive module connected between the second input-output port of the microcontroller and a ground, and the microcontroller is configured to internally connect the first input-output port and the third input-output port during a predetermined charging duration of the capacitive module in order to dynamically establish the reference voltage of the analog-digital converter.

8. A method for detecting a presence of a user in proximity of a presence detection sensor for unlocking an opening panel of a motor vehicle,
said sensor comprising:
- a microcontroller comprising an analog-digital converter, a first input-output port, a second input-output port forming a voltage reference of said analog-digital converter, a third input-output port for supplying the microcontroller with voltage, a fourth input-output port and a fifth input-output port, called "connection ports";
- a capacitive voltage divider connected to said connection input-output ports and comprising at least one detection capacitor and at least one storage capacitor; and
- a resistive module connected between the first input-output port and the second input-output port of the microcontroller and a capacitive module connected between the second input-output port of the microcontroller and a ground, and in that the microcontroller is configured to internally connect the first input-output port and the third input-output port during a predetermined charging duration of the capacitive module in order to dynamically establish the reference voltage of the analog-digital converter,
said method comprising:
- an initialization phase, during which the microcontroller firstly charges the capacitive module to the power supply voltage by connecting the first input-output port to the third input-output port during the charging duration, then, once charging is complete, performs a capacitive measurement in order to deduce therefrom an optimal reference voltage and a charging time required to obtain this optimal reference voltage;
- a reference acquisition phase, during which the microcontroller controls the capacitive voltage divider so that it performs a series of capacitive measurements at the optimal reference voltage determined during the initialization phase in order to obtain a reference value of the measured capacitive signal; and
- a measurement phase, during which the microcontroller controls the capacitive voltage divider at the determined optimal reference voltage and said capacitive voltage divider periodically measures the voltage value at the terminals of the storage capacitor, so as to detect or not detect a human presence in the proximity of the sensor.

9. The method as claimed in claim 8, wherein, when the microcontroller detects the saturation of the analog-digital converter during the measurement phase, then the microcontroller repeats the initialization and reference acquisition phases in order to modify the optimal reference voltage and the capacitive signal reference, then resumes the measurement phase.

10. The method as claimed claim 8, wherein the optimal reference voltage is higher than 10 to 20% at the voltage measured at the terminals of the storage capacitor.

11. The method as claimed claim 9, wherein the optimal reference voltage is higher than 10 to 20% at the voltage measured at the terminals of the storage capacitor.

* * * * *